(12) United States Patent
Kakiuchi et al.

(10) Patent No.: US 9,224,953 B2
(45) Date of Patent: Dec. 29, 2015

(54) METHOD AND APPARATUS FOR MANUFACTURING ORGANIC EL DEVICE

(71) Applicant: NITTO DENKO CORPORATION, Ibaraki, Osaka (JP)

(72) Inventors: Ryohei Kakiuchi, Ibaraki (JP); Satoru Yamamoto, Ibaraki (JP); Kanako Hida, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/235,986

(22) PCT Filed: Oct. 17, 2012

(86) PCT No.: PCT/JP2012/076846
§ 371 (c)(1),
(2) Date: Jan. 29, 2014

(87) PCT Pub. No.: WO2013/058283
PCT Pub. Date: Apr. 25, 2013

(65) Prior Publication Data
US 2014/0220722 A1    Aug. 7, 2014

(30) Foreign Application Priority Data

| Oct. 19, 2011 | (JP) | 2011-229872 |
| Nov. 9, 2011 | (JP) | 2011-245844 |
| Feb. 2, 2012 | (JP) | 2012-020884 |
| May 17, 2012 | (JP) | 2012-113290 |

(51) Int. Cl.
*H01L 51/56* (2006.01)
*H01L 51/00* (2006.01)
(Continued)

(52) U.S. Cl.
CPC .............. *H01L 51/001* (2013.01); *C23C 14/12* (2013.01); *C23C 14/562* (2013.01); *H01L 51/56* (2013.01);
(Continued)

(58) Field of Classification Search
None
See application file for complete search history.

(56) References Cited

U.S. PATENT DOCUMENTS

2003/0194497 A1* 10/2003 Takada et al. ................. 427/355
2004/0224433 A1* 11/2004 Yamazaki et al. .............. 438/39
(Continued)

FOREIGN PATENT DOCUMENTS

| EP | 1 115 268 A1 | 7/2001 |
| EP | 2 279 973 A1 | 2/2011 |

(Continued)

OTHER PUBLICATIONS

English Notification of Transmittal of Translation of the Internation Preliminary Report on Patentability of PCT/JP2012/076846 (form PCT/IB/338) dated May 1, 2014, with forms PCT/IB/373, PCT/ISA/237 and PCT/IB/326 (11 pages).
(Continued)

*Primary Examiner* — Daniel Luke
(74) *Attorney, Agent, or Firm* — Westerman, Hattori, Daniels & Adrian, LLP

(57) ABSTRACT

Provided are a method and an apparatus for manufacturing an organic EL device, which makes it possible to manufacture organic EL devices capable of suppressing quality degradation. The method for manufacturing an organic EL device, in which constituent layers of an organic EL element are formed by deposition over a substrate in the form of a strip, while the substrate is being moved in the longitudinal direction, includes a constituent layer-forming step of performing deposition over one surface of the substrate, while the substrate is being moved in the longitudinal direction, sequentially in first and second deposition units arranged along the moving direction of the substrate by discharging a vaporized material from an evaporation source. The constituent layer-forming step includes a plurality of upward deposition steps and a direction changing step.

4 Claims, 19 Drawing Sheets

(51) Int. Cl.
  *C23C 14/12* (2006.01)
  *C23C 14/56* (2006.01)
  *H05B 33/10* (2006.01)
  *B65H 23/32* (2006.01)

(52) U.S. Cl.
  CPC ............... *H05B 33/10* (2013.01); *B65H 23/32* (2013.01); *B65H 2301/5114* (2013.01); *B65H 2301/51145* (2013.01)

(56) References Cited

U.S. PATENT DOCUMENTS

| | | | |
|---|---|---|---|
| 2006/0003474 A1* | 1/2006 | Tyan et al. | 438/22 |
| 2009/0267507 A1* | 10/2009 | Takashima et al. | 313/511 |
| 2009/0272322 A1 | 11/2009 | Fujinami et al. | |
| 2012/0252147 A1* | 10/2012 | Takahashi et al. | 438/33 |
| 2013/0122625 A1* | 5/2013 | Sassa et al. | 438/46 |

FOREIGN PATENT DOCUMENTS

| | | |
|---|---|---|
| EP | 2393958 A2 | 12/2011 |
| JP | 64-068467 A | 3/1989 |
| JP | 2001-303249 A | 10/2001 |
| JP | 2008-287996 A | 11/2008 |
| JP | 2011-038162 A | 2/2011 |
| JP | 2012-516946 A | 7/2012 |
| TW | 200847845 A | 12/2008 |
| WO | 20081139788 A1 | 11/2008 |
| WO | 2010/090504 A2 | 8/2010 |

OTHER PUBLICATIONS

International Search Report dated Jan. 8, 2013, issued in corresponding application No. PCT/JP2012/076846.

Extended European Search Report dated Jul. 16, 2015, issued in counterpart European Patent Application No. 12840911.7 (6 pages).

* cited by examiner

F I G . 2
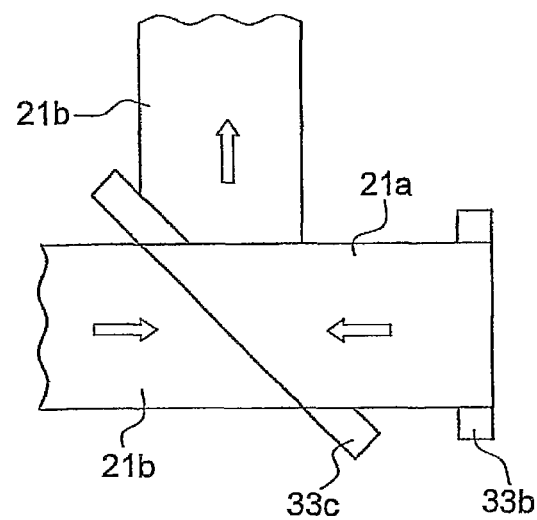

F I G. 6A
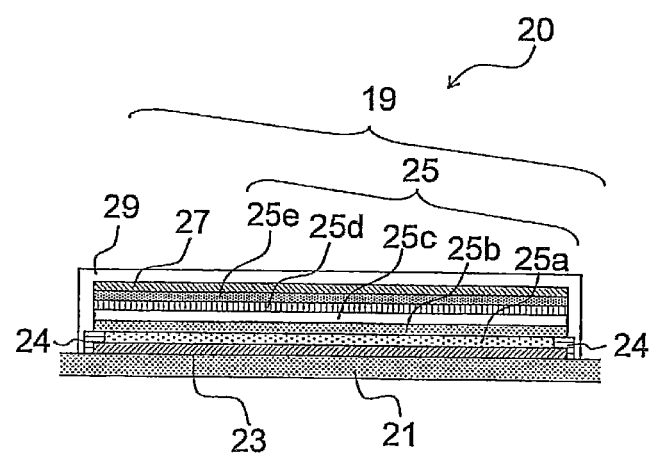

F I G . 8
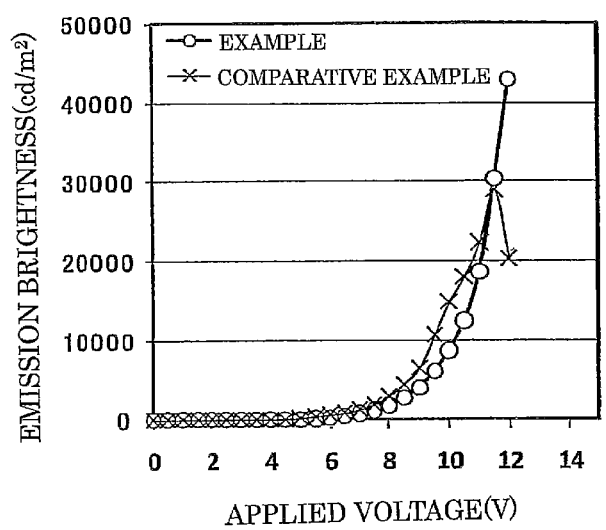

EXAMPLE    COMPARATIVE EXAMPLE

F I G . 13
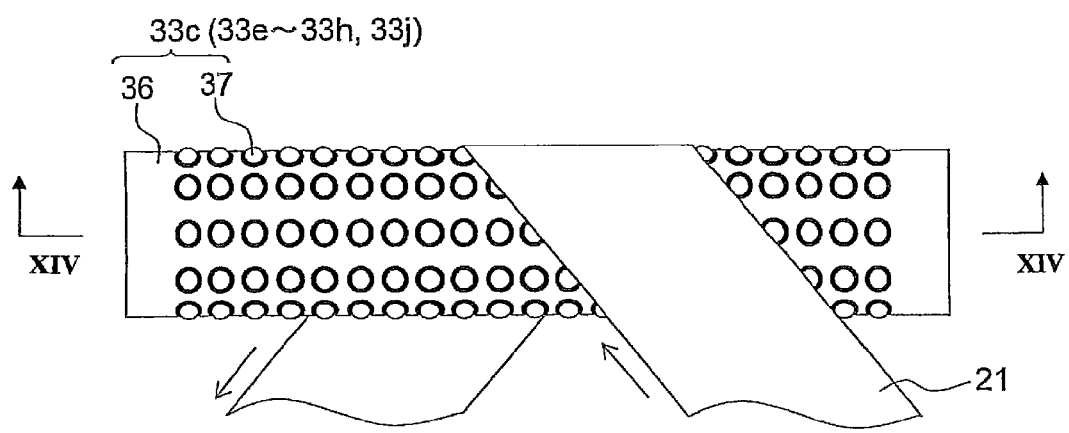

METHOD AND APPARATUS FOR MANUFACTURING ORGANIC EL DEVICE

This application claims priority to Japanese Patent Application Nos. 2011-229872, 2011-245844, 2012-020884, and 2012-113290, the disclosures of which are incorporated herein by reference in their entirety.

FIELD

The present invention relates to a method and an apparatus for manufacturing an organic EL device.

BACKGROUND

Recently, attention has been given to organic EL (electroluminescence) devices, as devices for use as next-generation light emitting displays with low consumption power. An organic EL device is basically composed of a substrate, and an organic EL element having an organic EL layer and a pair of electrode layers provided over the substrate. The organic EL layer is composed of at least one layer including a light emitting layer formed of an organic light emitting material. Such an organic EL device emits multicolor light derived from the organic light emitting material. Further, the organic EL device is a self-luminous device. Therefore, attention has been focused thereon for use as a display such as television (TV).

The organic EL device is, more specifically, configured to be formed by stacking an anode layer, an organic EL layer, and a cathode layer in this order over the substrate as constituent layers of an organic EL element.

In methods for manufacturing such an organic EL device, vacuum deposition and coating are commonly known as a technique for forming constituent layers of the organic EL element (which may be hereinafter referred to simply as constituent layers) over the substrate. Among these, vacuum deposition is mainly used, particularly because of the capability of increasing the purity of the materials for forming constituent layers and the ease of achieving long life span.

In the above-mentioned vacuum deposition, each constituent layer is formed by performing deposition using an evaporation source provided in a vacuum chamber at a position facing the substrate. Specifically, a material for forming the constituent layer is heated by a heating unit provided in the evaporation source so as to be vaporized. The vaporized material for forming the constituent layer (vaporized material) is discharged from the evaporation source. The vaporized material is deposited over the substrate as a constituent layer, thereby forming the constituent layer.

In such vacuum deposition, a roll process is employed from the viewpoint of cost reduction. The roll process is a process in which: a substrate in the form of a strip wound into a roll is continuously unwound; constituent layers are continuously deposited over the substrate while the unwound substrate is being moved; and the substrate over which the constituent layers have been deposited is wound up into a roll (see Patent Literature 1).

CITATION LIST

Patent Literature

Patent Literature 1: JP 2008-287996 A

SUMMARY

Technical Problem

However, in the above-mentioned roll process, when the evaporation source is arranged above the substrate and the vaporized material is discharged downwardly from the evaporation source toward the substrate so as to form the constituent layer, there may be cases where foreign matter such as dust is dropped from the evaporation source and adheres to the substrate, so as to be incorporated into the organic EL element. Such incorporation of foreign matter into the organic EL element causes adverse effects on light emission of the organic EL element.

Therefore, in order to suppress the incorporation of foreign matter, it is conceivable to form the constituent layer by arranging the evaporation source below the substrate and discharging the above-mentioned vaporized material upwardly from the evaporation source toward the substrate.

However, if all constituent layers are attempted to be formed by sequential deposition from below, it is necessary to sequentially align the evaporation sources below the substrate and move the substrate so as to pass above all the evaporation sources because the organic EL device is formed by stacking a plurality of constituent layers as mentioned above.

In this case, the region of the substrate that passes above the evaporation sources at a time is required to be very long, which makes it difficult to give sufficient tension to the substrate. As a result, the substrate easily warps or vibrates. Then, the contact between the deposition surface of the substrate and each evaporation source due to the warpage or vibration of the substrate may possibly cause damage on the substrate or the constituent layers formed over the substrate. Further, variation in the distance between the substrate and each evaporation source makes it difficult to appropriately control the thickness of each constituent layer, which may result in failure to obtain constituent layers with desired emission properties.

On the other hand, in the case where roller members and the like are used to support the substrate from below, in order to prevent the warpage or vibration of the substrate, the contact between the deposition surface of the substrate and each roller member may possibly cause damage on the formed constituent layers.

In this way, light emission failure due to the incorporation of foreign matter or the difficulty in thickness control, or damage on the deposition surface of the substrate due to the contact with the evaporation sources, the roller members, etc., causes degradation in quality of the organic EL device.

In view of the above-mentioned problems, it is an object of the present invention to provide a method and an apparatus for manufacturing an organic EL device which make it possible to manufacture organic EL devices capable of suppressing quality degradation.

Solution to Problem

The method for manufacturing an organic EL device according to the present invention, in which constituent layers of an organic EL element are formed by deposition over a substrate in the form of a strip, while the substrate is being moved in the longitudinal direction, includes: a constituent layer-forming step of performing deposition over one surface of the substrate, while the substrate is being moved in the longitudinal direction, sequentially in at least first and second deposition units arranged along the moving direction of the substrate by discharging a vaporized material from an evaporation source. The constituent layer-forming step includes: an upward deposition step of performing deposition over a deposition surface of the substrate, while the substrate is being moved with its deposition surface facing downward, in the first and second deposition units by discharging the vaporized material from the evaporation source arranged below the substrate toward the deposition surface; and a direction changing step of turning the substrate conveyed from the first deposition unit, by means of a guide mechanism provided between the first deposition unit and the second deposition unit, so that the deposition surface faces upward and thereafter downward, while supporting the substrate from the non-deposition surface side so that the non-deposition surface of the substrate faces the inside of the turn, so as to guide the substrate to the second deposition unit.

In the above-mentioned manufacturing method, it is preferable that the guide mechanism have a plurality of roller members that support the non-deposition surface, and at least one of the roller members be arranged along a direction inclined to the width direction of the substrate.

In the above-mentioned manufacturing method, the at least one of the roller members is preferably arranged along a direction inclined at 45° to the width direction.

The apparatus for manufacturing an organic EL device according to the present invention, in which constituent layers of an organic EL element are formed by deposition over a substrate in the form of a strip, while the substrate is being moved in the longitudinal direction, includes: at least first and second deposition units arranged along the moving direction of the substrate, the deposition units each including an evaporation source arranged below the substrate that is being moved, the deposition units being configured to perform deposition by discharging a vaporized material from the evaporation source toward a deposition surface of the substrate, while the substrate is being moved with its deposition surface facing downward; and a direction changing section including a guide mechanism provided between the first deposition unit and the second deposition unit, the guide mechanism being configured to turn the substrate conveyed from the first deposition unit so that the deposition surface faces upward and thereafter downward, while supporting the substrate from a non-deposition surface side so that the non-deposition surface of the substrate faces the inside of the turn, so as to guide the substrate to the second deposition unit.

BRIEF DESCRIPTION OF DRAWINGS

FIG. 2 is a view from above showing the configuration of roller members of one guide mechanism in FIG. 1.

FIG. 6A is a schematic sectional view schematically showing the layer configuration of an organic EL element.

FIG. 8 is a graph showing the relationship between applied voltage and emission brightness in the test samples of Example and Comparative Example.

FIG. 13 is a schematic side view showing one embodiment of the roller members.

DESCRIPTION OF EMBODIMENTS

Hereinafter, embodiments of a method and an apparatus for manufacturing an organic EL device according to the present invention are described with reference to the drawings.

First, embodiments of the apparatus for manufacturing an organic EL device according to the present invention are described.

Figure 1:
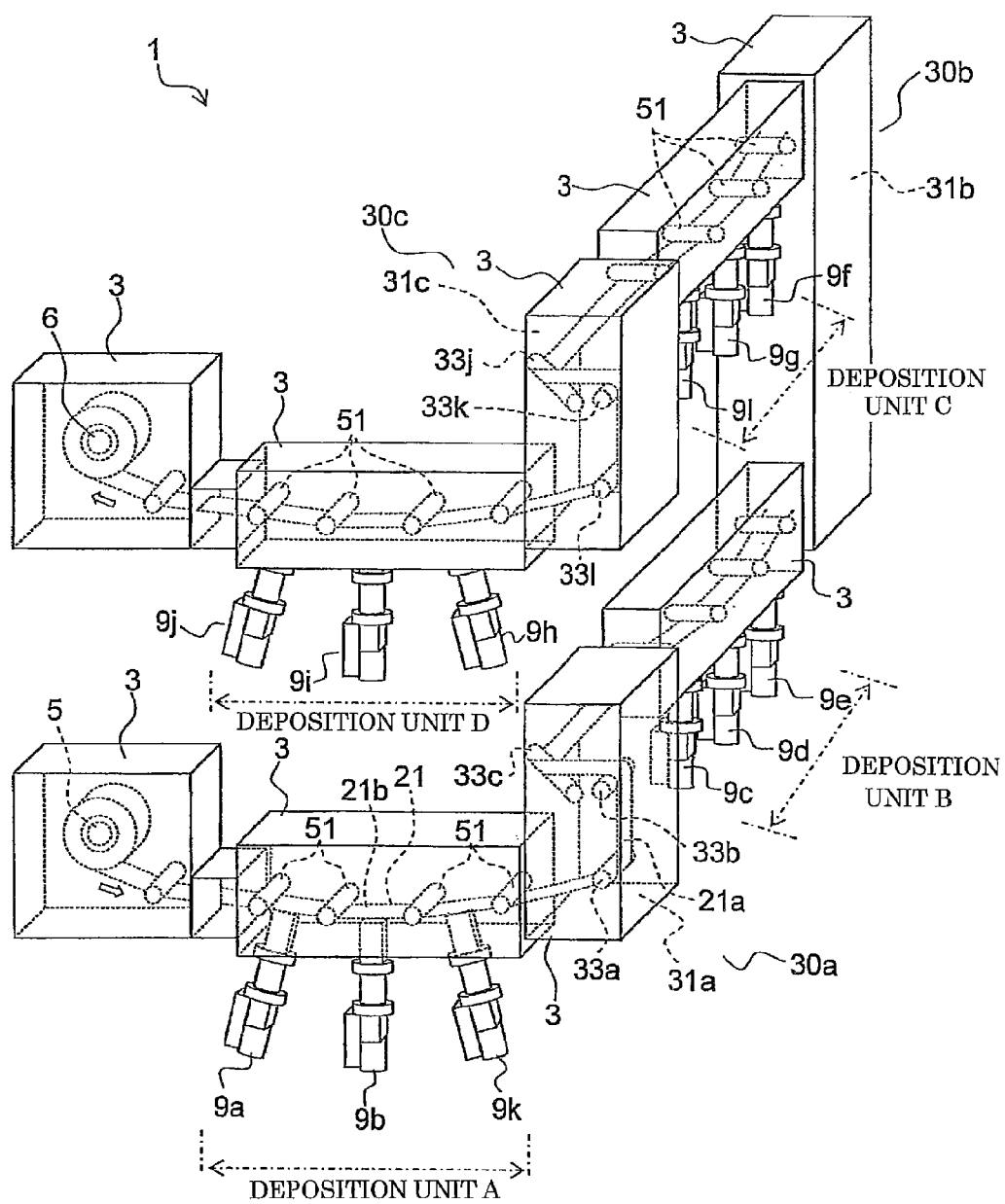
FIG. 1 is a schematic perspective view schematically showing an apparatus for manufacturing an organic EL device according to one embodiment of the present invention.

An organic EL device-manufacturing apparatus 1 is configured to form an organic EL element 19 by deposition over a substrate 21 in the form of a strip, while the substrate 21 is being moved in the longitudinal direction. As shown in FIG. 1, the manufacturing apparatus 1 includes deposition units A to D arranged along the moving direction of the substrate 21, and direction changing sections 30a, 30b, and 30c respectively having guide mechanisms 31a, 31b, and 31c.

The deposition units A to D are arranged along the moving direction of the substrate 21 (see white arrows). Those deposition units A to D are arranged in the order of the deposition units A, B, C, and D from the upstream side to the downstream side in the substrate moving direction. Further, the deposition units A to D are provided with evaporation sources 9a to 9l arranged below the substrate 21 that is being moved. The deposition units A to D perform deposition by discharging vaporized materials from the evaporation sources 9a to 9l to the deposition surface 21a of the substrate 21 while the substrate 21 is being moved with its deposition surface 21a facing downward.

Figure 4:
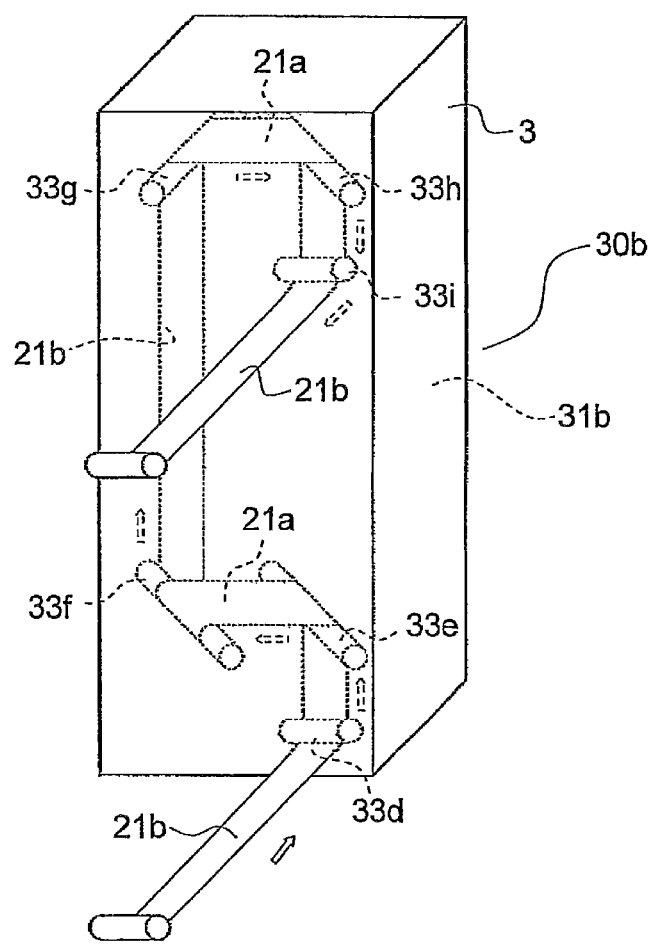
FIG. 4 is a view from above showing the configuration of roller members of another guide mechanism than that in FIG. 1.

As shown in FIG. 1 and FIG. 4, the direction changing unit 30a is arranged between the deposition unit A and the deposition unit B. The direction changing unit 30b is arranged between the deposition unit B and the deposition unit C. The direction changing unit 30c is arranged between the deposition unit C and the deposition unit D. The details of the direction changing units 30a to 30c are described later.

In this embodiment, the deposition unit A and the deposition unit B correspond respectively to the first deposition unit and the second deposition unit of the present invention, in the relationship between the deposition unit A and deposition unit B with the direction changing unit 30b interposed therebetween. In the relationship between the deposition unit B and the deposition unit C with the direction changing unit 30b interposed therebetween, the deposition unit B and the deposition unit C correspond respectively to the first deposition unit and the second deposition unit of the present invention. In the relationship between the deposition unit C and the deposition unit D with the direction changing unit 30c interposed therebetween, the deposition unit C and the deposition unit D correspond respectively to the first deposition unit and the second deposition unit of the present invention.

The manufacturing apparatus 1 includes a substrate feeding unit 5 provided with a substrate feeding mechanism for feeding the substrate 21. The substrate 21 fed from the substrate feeding unit 5 is sequentially supplied to the deposition units A to D and is moved passing through these units. Further, the manufacturing apparatus 1 includes a substrate take-up unit 6 provided with a substrate take-up mechanism that winds up the substrate 21. The substrate 21 that has been moved through the deposition unit D is wound up by the substrate take-up unit 6.

The manufacturing apparatus 1 includes a plurality of vacuum chambers 3. In the respective vacuum chambers 3, the substrate feeding unit 5, the deposition unit A, the deposition unit B, the deposition unit C, the deposition unit D, the direction changing unit 30a, the direction changing unit 30b, the direction changing unit 30c, and the substrate take-up unit 6 are arranged.

The inside of each vacuum chamber 3 is brought into a reduced pressure state by a vacuum generating mechanism (not shown), so that a vacuum region should be formed thereinside. Further, adjacent vacuum chambers 3 are in communication with one another via openings (not shown) while the vacuum state is maintained. Through these openings, the substrate 21 can be moved from the substrate feeding unit 5 sequentially toward the downstream side to the substrate take-up unit 6. Specifically, the substrate 21 unwound from the substrate feeding unit 5 is moved through the deposition unit A, the direction changing unit 30a, the deposition unit B, the direction changing unit 30b, the deposition unit C, the direction changing unit 30c, and the deposition unit D, and thereafter is wound up by the substrate take-up unit 6.

The substrate feeding unit 5 unwinds the substrate 21 in the form of a strip wound into a roll and supplies it to the deposition units A to D. Further, the substrate take-up unit 6 winds up the substrate 21 that has been unwound from the substrate feeding unit 5 and moved through the deposition units A to D, by winding it into a roll. That is, the substrate 21 is unwound and wound up respectively by the substrate feeding unit 5 and the substrate take-up unit 6.

As a material for forming the substrate 21, materials having flexibility that is not damaged when being guided by the guide mechanisms 31a to 31c as described later can be used. Examples of such materials include metal materials, nonmetal inorganic materials, and resin materials.

Examples of the metal materials include stainless steel, alloys such as iron-nickel alloy, copper, nickel, iron, aluminum, and titanium. Further, examples of the above-mentioned iron-nickel alloy include alloy 36 and alloy 42. Among these, the above-mentioned metal material is preferably stainless steel, copper, aluminum, or titanium, from the viewpoint of ease of application to the roll process.

As the above-mentioned nonmetal inorganic materials, glass can be mentioned, for example. In this case, thin film glass to which flexibility is imparted can be used as a substrate formed of a nonmetal inorganic material.

As the above-mentioned resin materials, synthetic resins such as thermosetting resins and thermoplastic resins can be mentioned. Examples of the synthetic resins include a polyimide resin, a polyester resin, an epoxy resin, a polyurethane resin, a polystyrene resin, a polyethylene resin, a polyamide resin, an acrylonitrile-butadiene-styrene (ABS) copolymer resin, a polycarbonate resin, a silicone resin, and a fluororesin. Further, as a substrate formed of such a resin material, films of the above-mentioned synthetic resins can be used, for example.

The width, thickness, and length of the substrate 21 are not specifically limited and can be appropriately set depending on the dimensions of the organic EL element 19 formed over the substrate 21, the configuration of the roller members of the guide mechanisms 31a to 31c, etc. As described later, the width of the substrate 21 is preferably small, in that the elongation of roller members when inclined with respect to the longitudinal direction of the substrate 21 as described later can be suppressed.

The evaporation sources 9a to 9l provided in the deposition units A to D are arranged below the substrate 21. More specifically, the substrate 21 is moved through the deposition units A to D substantially in the horizontal direction with its deposition surface 21a facing downward. Further, the evaporation sources 9a to 9l arranged in the deposition units A to D are each provided through the bottom surface, from the outside (lower side of FIG. 1) to the inside (upper side of FIG. 1), of the corresponding vacuum chamber 3. Furthermore, each of the evaporation sources 9a to 9l is arranged with its opening facing the deposition surface 21a of the substrate 21 in the vacuum chamber 3. In FIG. 1, illustration of the portions that penetrate into the vacuum chamber 3 in the evaporation sources arranged in the deposition units B, C, and D is omitted. Furthermore, the evaporation sources 9a to 9l each have a heating unit (not shown). The heating unit vaporizes the above-mentioned material accommodated in each evaporation source by heating, and the vaporized material is discharged upwardly through the opening.

The vacuum chambers 3 are configured so as to be capable of maintaining their vacuum states even if the evaporation sources 9a to 9l penetrate therethrough as mentioned above. Further, in this embodiment, tension rollers 51 that give a tension to the substrate 21 by the contact with a non-deposition surface 21b of the substrate 21 are arranged in the respective deposition units A to D. The tension rollers 51 are not essential components, and these tension rollers may not be provided.

At least one evaporation source only needs to be provided in each of the deposition units A to D, corresponding to the number of layers to be formed. In this embodiment, the evaporation sources 9a, 9b, and 9k are arranged in the deposition unit A, the evaporation sources 9c, 9d, and 9e are arranged in the deposition unit B, the evaporation sources 9f, 9g, and 9l are arranged in the deposition unit C, and the evaporation sources 9h, 9i, and 9j are arranged in the deposition unit D. Further, the evaporation sources 9a to 9l are arranged below the substrate 21 at positions close to the substrate 21. That is, they are arranged at positions such that the distance between the substrate 21 and the opening end (nozzle) of each of the evaporation sources 9a to 9l (shortest distance) is not more than 10 mm.

The evaporation source 9a arranged in the deposition unit A vaporizes an anode layer-forming material and discharges it, thereby forming an anode layer 23 over the deposition surface 21a of the substrate 21, as shown in FIG. 6A to FIG.

6C. Further, the evaporation source 9b arranged in the deposition unit A vaporizes an edge cover-forming material and discharges it, thereby forming an edge cover 24 that covers the peripheral edges of the anode layer 23. This edge cover covers the periphery of the anode layer 23, thereby preventing the contact between the anode layer 23 and a cathode layer 27.

Further, the evaporation sources 9c, 9d, and 9e arranged in the deposition unit B form three of five organic EL layer-constituent layers that constitute an organic EL layer 25. The evaporation sources 9f and 9g arranged in the deposition unit C form the remaining two of the organic EL layer-constituent layers.

Furthermore, the evaporation source 9h and the evaporation source 9i arranged in the deposition unit D serve to form two cathode layer-constituent layers that constitute a cathode layer 27. Further, the evaporation source 9j arranged in the deposition unit D serves to form a sealing layer 29. This sealing layer 29 covers the anode layer 23, the organic EL layer 25, and the cathode layer 27, thereby preventing these layers from being in contact with the air. Further, in this embodiment, both the evaporation source 9k arranged in the deposition unit A and the evaporation source 9l arranged in the deposition unit C are provided as a backup. However, it is also possible to form other constituent layers using these evaporation sources.

The anode layer 23 only needs to be formed of at least one anode layer-constituent layer. As a material for forming such an anode layer-constituent layer, gold, silver, aluminum, etc., can be mentioned. In the apparatus configuration shown in FIG. 1, one Al layer is formed as the anode layer 23, for example.

Figure 6B:
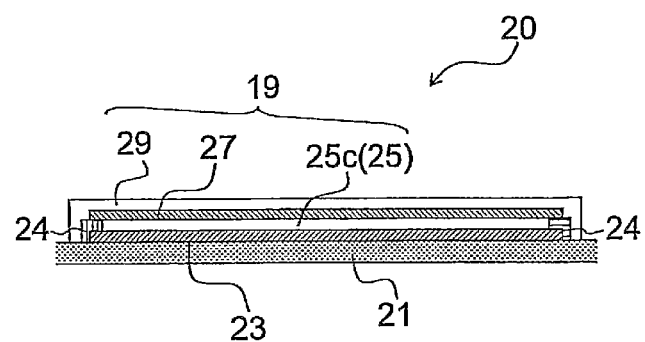
FIG. 6B is a schematic sectional view schematically showing the layer configuration of an organic EL element.
Figure 6C:
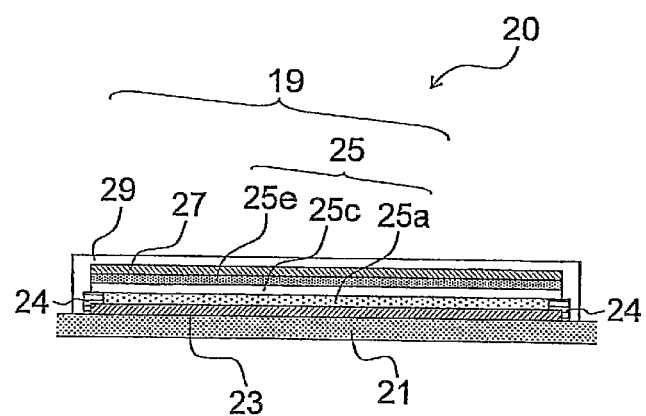
FIG. 6C is a schematic sectional view schematically showing the layer configuration of an organic EL element.

The organic EL layer 25 only needs to be composed of at least one organic EL layer-constituent layer. In the apparatus configuration shown in FIG. 1, a five-layered stack composed of five organic EL layer-constituent layers is formed as the organic EL layer 25. As these organic EL layer-constituent layers, a hole injection layer 25a, a hole transporting layer 25b, a light emitting layer 25c, an electron transporting layer 25d, and an electron injection layer 25e, for example, are stacked in this order from the anode layer 23 side, as shown in FIG. 6A. The layer configuration of the organic EL layer 25 is not specifically limited, as long as it includes at least the light emitting layer 25c as an organic EL layer-constituent layer. Besides that, the organic EL layer, for example, may be a three-layered stack in which the hole injection layer 25a, the light emitting layer 25c, and the electron injection layer 25e are stacked in this order, as shown in FIG. 6C. Other than that, it may be a four-layered stack excluding the hole transporting layer 25b or the electron transporting layer 25d from the above-mentioned five layers shown in FIG. 6A, as needed. Furthermore, the organic EL layer may be composed of only the one light emitting layer 25c, as shown in FIG. 6B.

Examples of the material that can be used for forming the hole injection layer 25a include copper phthalocyanine (CuPc), 4,4'-bis[N-4-(N,N-di-m-tolylamino)phenyl]-N-phenylamino]biphenyl (DNTPD), and HAT-CN.

Examples of the material that can be used for forming the hole transporting layer 25b include 4,4'-bis[N-(1-naphthyl)-N-phenyl-amino]biphenyl (α-NPD) and N,N'-diphenyl-N,N'-bis(3-methylphenyl)-1,1'biphenyl-4,4'diamine (TPD).

Examples of the material that can be used for forming the light emitting layer 25c include tris(8-hydroxyquinoline) aluminum (Alq3) and iridium complex (Ir(ppy)3)-doped 4,4'-N,N'-dicarbazolyl biphenyl (CBP).

Examples of the material that can be used for forming the electron injection layer 25b include lithium fluoride (LiF), cesium fluoride (CsF), and lithium oxide ($Li_2O$).

Examples of the material that can be used for forming the electron transporting layer 25e include tris (8-hydroxyquinoline) aluminum (Alq3), bis(2-methyl-8-quinolinolato)-4-phenylphenolato-aluminum (BAlq), OXD-7(1,3-bis[5-(p-tert-butylphenyl)-1,3,4-oxadiazole-2-yl])benzene, and lithium fluoride (LiF).

The cathode layer 27 only needs to be formed of at least one cathode layer-constituent layer. Lithium fluoride (LiF), and an alloy containing magnesium (Mg), silver (Ag), or the like, can be used as a material for forming the cathode layer-constituent layer. In the apparatus configuration shown in FIG. 1, a two-layered stack of a LiF layer and a Mg—Ag alloy layer, for example, is formed over the organic EL layer as the cathode layer 27.

As a material for forming the edge cover 24, silicon oxide ($SiO_x$) molybdenum trioxide ($MoO_3$), vanadium pentoxide ($V_2O_5$), or the like, can be mentioned. As a material for forming the sealing layer 29, molybdenum trioxide ($MoO_3$), silicon oxynitride ($SiNO_x$), silicon oxycarbide (SiOC), or the like, can be mentioned. As $SiO_x$, $SiO_2$ can be mentioned, for example. As $SiNO_x$, SiNO can be mentioned, for example.

The thickness of each of the constituent layers of the anode layer 23, the organic EL layer 25, and the cathode layer 27 mentioned above is generally designed to be several nm to several tens of nm. However, such thickness is not specifically limited and is appropriately designed depending on the constituent layer-forming materials to be used, the emission properties, etc. Further, the thickness of the edge cover 24 and the sealing layer 29 mentioned above is also not specifically limited, and may be appropriately set so as to achieve the functions of these layers, and so as not to inhibit the formation of the anode layer 23, the organic EL layer 25, and the cathode layer 27 mentioned above, or the light emission of the organic EL device.

The direction changing units 30a to 30c respectively include the guide mechanisms 31a, 31b, and 31c. The guide mechanisms 31a to 31c are each configured to turn the substrate 21 conveyed from the deposition unit A, B, or C on the upstream side in the moving direction of the substrate 21 so that the deposition surface 21a faces upward and then faces downward, while supporting the substrate 21 from the non-deposition surface 21b side so that the non-deposition surface 21b of the substrate 21 faces the inside of the turn, so as to guide the substrate 21 to the deposition unit B, C, or D on the downstream side in the above-mentioned moving direction.

Among these guide mechanisms 31a to 31c, the guide mechanism 31a is first described.

Figure 3:
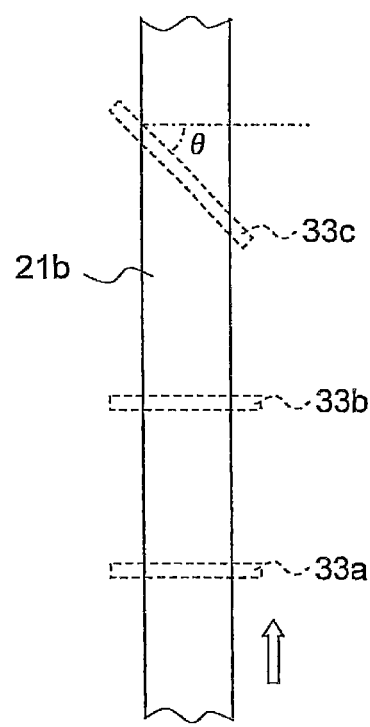
FIG. 3 is a schematic plan view schematically showing the positions at which a non-deposition surface of a substrate moving through the one guide mechanism in FIG. 1 is in contact with the roller members.

As shown in FIGS. 1 to 3, the guide mechanism 31a has a plurality of roller members 33a, 33b, and 33c. These roller members 33a, 33b, and 33c are each a guide member that guides the substrate 21 to a specific direction. The roller members 33a and 33b are each arranged substantially in the horizontal direction along the width direction (the direction perpendicular to the longitudinal direction) of the substrate 21. The roller member 33c is arranged substantially in the horizontal direction and inclined at an angle θ (which is herein 45°) to the width direction of the substrate 21. The angle θ of the roller member to the width direction of the substrate 21 herein means the angle at which the roller member is inclined toward the upstream side of the substrate 21 (the downward direction in FIG. 3) with respect to the width direction of the substrate 21 (the left-right direction in FIG. 3) on the non-deposition surface 21b of the substrate 21.

Further, the roller member 33a is arranged in a lower part of the guide mechanism 31a. The roller member 33b is arranged above the roller member 33a in parallel to the roller member 33a. The roller member 33c is arranged laterally of the roller member 33b at substantially the same level as the roller member 33b.

The substrate 21 conveyed from the deposition unit A is hung over the roller member 33a, the roller member 33b, and the roller member 33c, with its non-deposition surface 21b in contact with these roller members. The substrate 21 is guided to the downstream side while the non-deposition surface 21b is supported by these roller members.

Specifically, the substrate 21 conveyed from the deposition unit A is first bent substantially perpendicularly upward around the roller member 33a serving as a support axis, and is then moved to the roller member 33b. Subsequently, the substrate 21 is bent substantially perpendicularly laterally (to the left side in FIG. 1) around the roller member 33b serving as a support axis, and is then moved to the roller member 33c. The substrate 21 is bent around the roller members 33a and 33b serving as support axes, thereby allowing the deposition surface 21a of the substrate 21 to be turned over from the state before being supported by the roller member 33a so as to face upward.

Subsequently, the substrate 21 is bent laterally (to the far side in the figure) so that the deposition surface 21a of the substrate 21 is turned over substantially 180° around the roller member 33c serving as a support axis, and is then moved to the deposition unit B. The substrate 21 is bent around the roller member 33c serving as a support axis, thereby allowing the deposition surface 21a of the substrate 21 to face downward.

In this way, the substrate 21 whose deposition surface 21a has faced downward before being guided by the guide mechanism 31a is turned so that the deposition surface 21a faces upward and thereafter downward, while being supported from the non-deposition surface 21b side by the roller members 33a to 33c so that the non-deposition surface 21b faces the inside of the turn. The substrate 21 is conveyed to the deposition unit B with the deposition surface 21a facing downward.

Next, the guide mechanism 31b is described.

Figure 5:
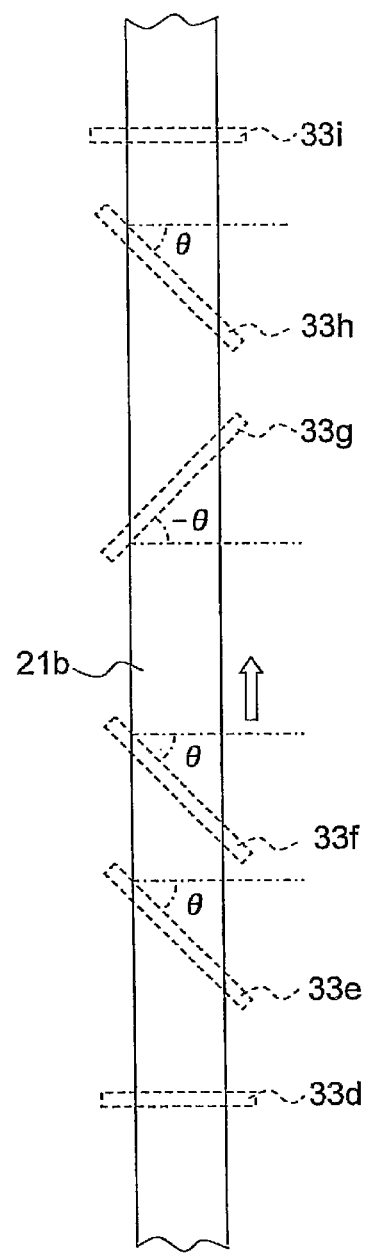
FIG. 5 is a schematic plan view schematically showing the positions at which the non-deposition surface of the substrate moving through the guide mechanism in FIG. 4 is in contact with the roller members.

As shown in FIGS. 4 and 5, the guide mechanism 31b has a plurality of roller members 33d, 33e, 33f, 33g, 33h, and 33i. These roller members 33d, 33e, 33f, 33g, 33h, and 33i are each a guide member that guides the substrate 21 to a specific direction. The roller members 33d and 33i are arranged substantially in the horizontal direction along the width direction of the substrate 21. The roller members 33e, 33f, and 33h are arranged substantially in the horizontal direction, and inclined at the angle θ (which is herein 45°) to the width direction of the substrate 21. The roller member 33g is arranged substantially in the horizontal direction, and inclined at an angle −θ (which is herein −45°, for example) to the width direction of the substrate 21.

Further, the roller member 33d is arranged in a lower part of the guide mechanism 31b. The roller member 30e is arranged above the roller member 33d. The roller member 33f is arranged laterally of the roller member 33e (on the left side in FIG. 3) in parallel to the roller member 33e. The roller member 33g is arranged above the roller member 33f. The roller member 33h is arranged laterally of the roller member 33g (on the right side in FIG. 3). The roller member 33i is arranged below the roller member 33h above the roller member 33d.

The substrate 21 conveyed from the deposition unit B is hung over the roller member 33d, the roller member 33e, the roller member 33f, the roller member 33g, the roller member 33h, and the roller member 33i, with its non-deposition surface 21b in contact with these roller members. The substrate 21 is guided to the downstream side while being supported by these roller members.

Specifically, the substrate 21 conveyed from the deposition unit B is bent substantially perpendicularly upward around the roller member 33d serving as a support axis, and is then moved to the roller member 33e. Subsequently, the substrate 21 is bent substantially perpendicularly laterally (to the left side in FIG. 3) around the roller member 33e serving as a support axis, and is then moved to the roller member 33f. The substrate 21 is bent around these roller members 33d and 33e serving as support axes, thereby allowing the deposition surface 21a of the substrate 21 to be turned over from the state before being supported by the roller member 33d so as to face upward.

Subsequently, the substrate 21 is bent upward around the roller member 33f serving as a support axis so as to be wound and hung around the roller member 33f, and is then moved to the roller member 33g. The substrate 21 is bent around the roller member 33f serving as a support axis, thereby allowing the deposition surface 21a of the substrate 21 to face downward and then face laterally.

At this time, the deposition surface 21a is turned more than one revolution from the state before the substrate 21 is supported by the roller member 33d. That is, the second revolution of the deposition surface 21a has started.

Subsequently, the substrate 21 is bent substantially perpendicularly laterally (to the right side in FIG. 4) around the roller member 33g serving as a support axis, and is then moved to the roller member 33h. The substrate 21 is bent around the roller member 33g serving as a support axis, thereby allowing the deposition surface 21a to face upward.

Subsequently, the substrate 21 is bent substantially perpendicularly downward around the roller member 33h serving as a support axis, and is then moved to the roller member 33i. Furthermore, the substrate 21 is bent substantially perpendicularly laterally around the roller member 33i serving as a support axis, and is then moved to the deposition unit C. The substrate 21 is bent around these roller members 33h and 33i serving as support axes, thereby allowing the deposition surface 21a of the substrate 21 to be turned over from the state before being supported by the roller 33h so as to face downward.

In this way, the substrate 21 whose the deposition surface 21a has faced downward before being guided by the guide mechanism 31b is turned so that the deposition surface 21a faces upward and thereafter downward (making two revolutions), while being supported from the non-deposition surface 21b side by the roller members 33d to 33i so that the non-deposition surface 21b faces the inside of the turn. The substrate 21 is conveyed to the deposition unit C with the deposition surface 21a facing downward.

Next, the guide mechanism 31c is described.

As shown in FIG. 1, the guide mechanism 31c has roller members with the same configuration as in the guide mechanism 31a. That is, the guide mechanism 31c has roller members 33j, 33k, and 33l. These roller members 33j, 33k, and 33l respectively correspond to the roller members 33c, 33b, and 33a of the guide mechanism 31a. Further, the substrate 21 is hung over the roller members 33j to 33l in the guide mechanism 31c, in the same manner as in the guide mechanism 31a. The moving direction of the substrate 21 passing on the roller members 33j to 33l is opposite to that in the guide mechanism 31a. Other configurations are the same as those in the guide mechanism 31a. Therefore, description thereof is omitted.

In the guide mechanism 31c, the substrate 21 conveyed from the deposition unit C is guided to the downstream side with its non-deposition surface 21b supported by the roller member 33j, the roller member 33k, and the roller member 33l.

Specifically, the substrate 21 conveyed from the deposition unit C is first bent laterally (to the right side in the figure) around the roller member 33j serving as a support axis so as to be turned over substantially 180°, and is then moved to the roller member 33k. The substrate 21 is bent around the roller member 33j serving as a support axis, thereby allowing the deposition surface 21a of the substrate 21 to be turned over from the state before being supported by the roller member 33j so as to face upward.

Subsequently, the substrate 21 is bent substantially perpendicularly downward around the roller member 33k serving as a support axis, and is then moved to the roller member 33l. Furthermore, the substrate 21 is bent substantially perpendicularly at the roller member 33l, and is then moved to the deposition unit D. The substrate 21 is bent around these roller members 33k and 33l serving as support axes, thereby allowing the deposition surface 21a of the substrate 21 to face downward.

In this way, the substrate 21 whose the deposition surface 21a has faced downward before being guided by the guide mechanism 31c is turned so that the deposition surface 21a faces upward and thereafter downward, while being supported from the non-deposition surface 21b side by the roller members 33j to 33l so that the non-deposition surface 21b faces the inside of the turn. The substrate 21 is conveyed to the deposition unit D with the deposition surface 21a facing downward.

Figure 10:
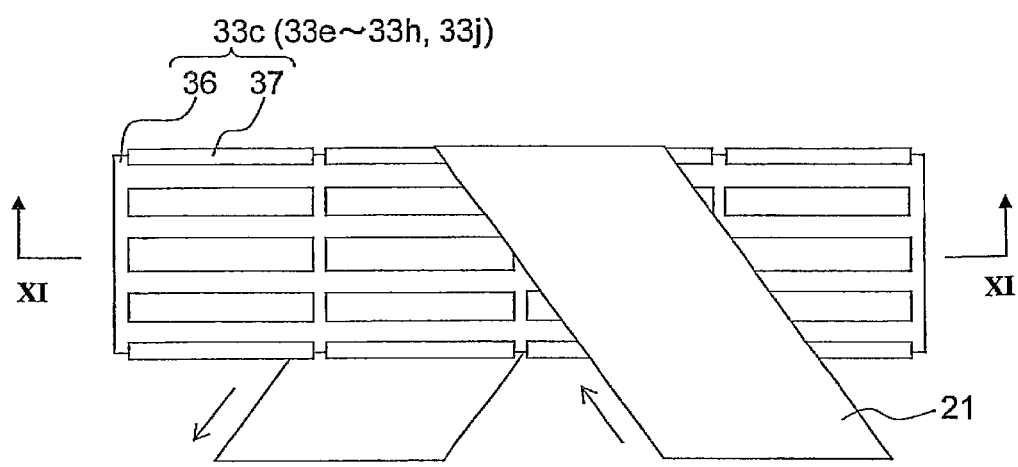
FIG. 10 is a schematic side view showing one embodiment of the roller members.
Figure 11:
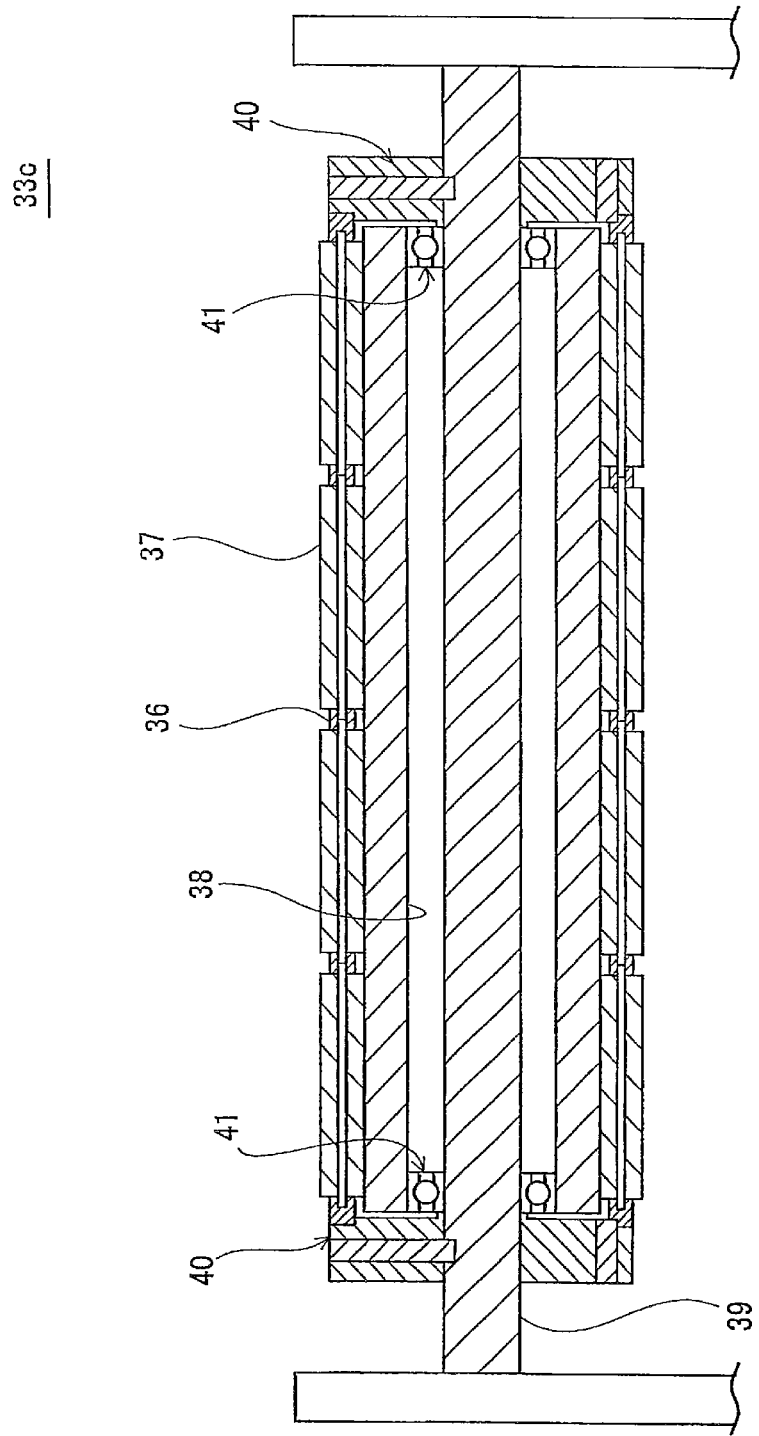
FIG. 11 is a sectional view taken along the line XI-XI of FIG. 10.
Figure 12:
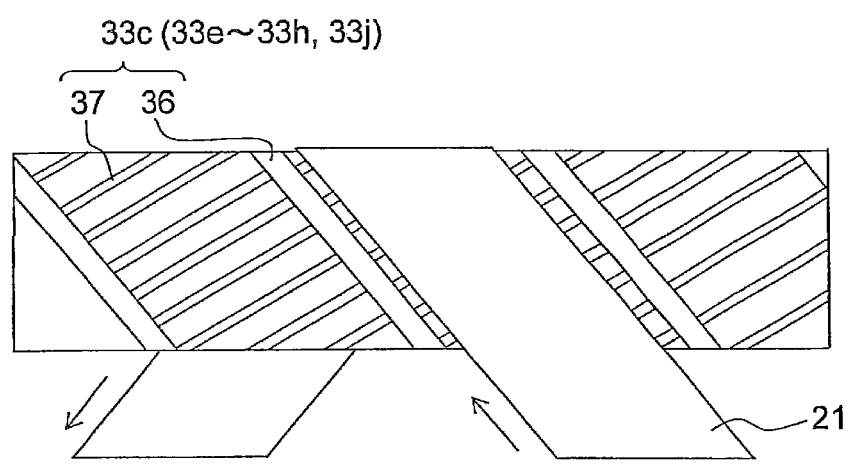
FIG. 12 is a schematic side view showing one embodiment of the roller members.

The roller members 33c, 33e to 33h, and 33j each preferably include a cylindrical roller body 36 and a plurality of rotatable members 37 projecting outward from the roller body 36 so as to be capable of supporting the substrate 21 on their circumferential surfaces while being rotatably supported on the outer surface of the roller body 36, as shown in FIG. 10, FIG. 11 and FIG. 12. That is, the roller members 33c, 33e to 33h, and 33j each preferably have a bearing structure including the roller body 36 and the rotatable members 37.

The roller members 33c, 33e to 33h, and 33j having such a bearing structure can reduce the friction that occurs between the substrate 21 and each roller member when the substrate 21 is moved while being bent around the roller member serving as a support axis. This can prevent the region in which the substrate 21 is in contact with the roller member (contact region) from deviating in the longitudinal direction of the roller member, and is thus effective. Further, since the deviation of the contact region can be prevented in this way, it is also possible to employ a configuration in which the substrate 21 is moved while being wound around the roller member into a spiral by increasing the length of the roller member enough thereto. This increases the contact region of the roller member with the substrate 21, and therefore the substrate is more stably moved (conveyed), which is advantageous.

In FIG. 10, the rotatable members 37 are each a cylindrical needle roller, and the roller members 33c, 33e to 33h, and 33j each have a needle bearing structure including the roller body 36 and the rotatable members 37 that are each a needle roller.

Figure 16:
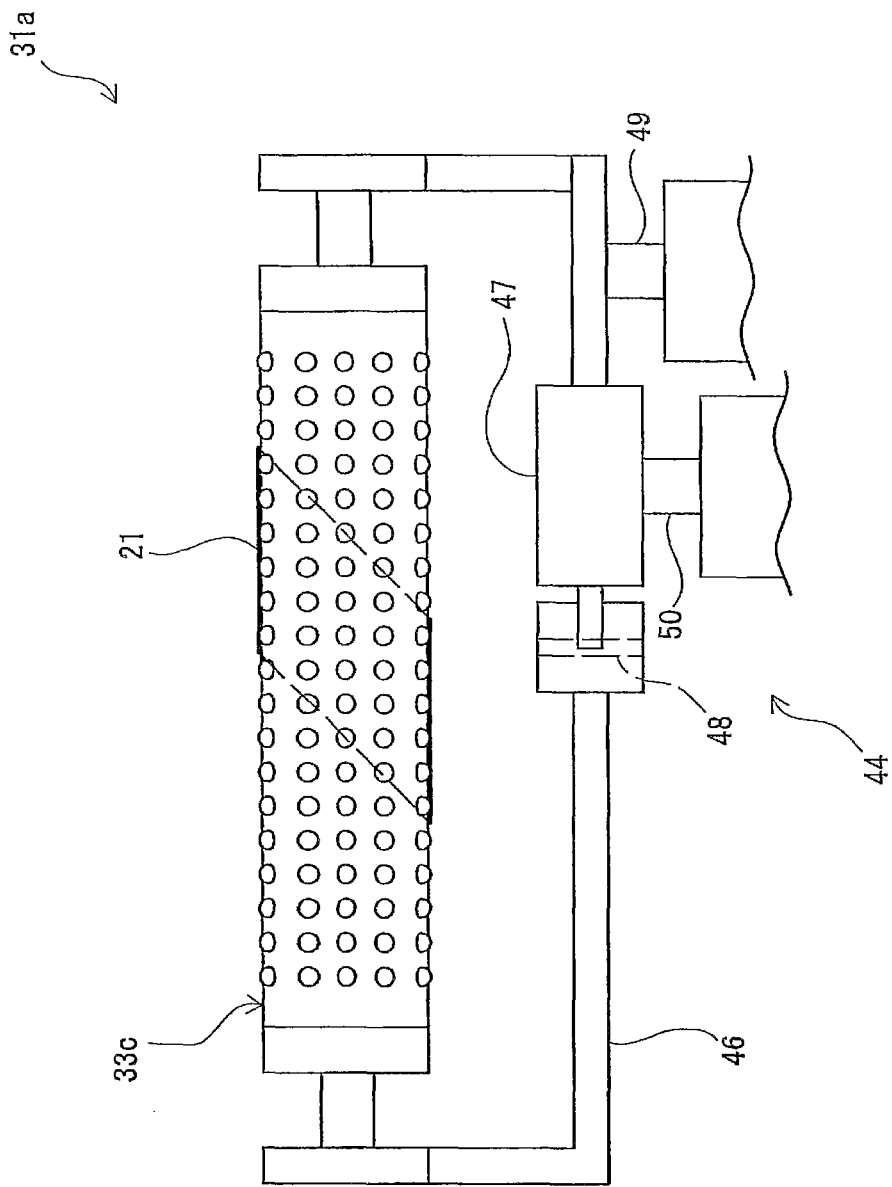
FIG. 16 is a schematic bottom view of the guide mechanism of FIG. 15.

More specifically, a plurality of rolling members 37 shown in FIG. 10 and FIG. 11 are aligned in parallel, for example, along the circumferential direction over the outer circumference of the guide member 33c so that the substrate 21 extends over the rolling members 37 in contact therewith. Accordingly, when the substrate 21 is hung along the circumferential direction over the outer circumference of the guide member 33c, the direction in which the guide member 33c rotates and the direction in which the substrate 21 is conveyed match each other. As shown in FIG. 16, the guide member 33c includes the guide body 36, a support member 38, a shaft 39, securing members 40, and bearings 41, which have the same functions as in the guide member 33c of the above-mentioned embodiment (see FIG. 10).

In FIG. 12, the guide member 33c has the rotatable members 37 that are each a needle roller, in the same manner as in FIG. 10. The rotatable members 37 each have a structure of being arranged in a spiral manner around the roller body 36.

More specifically, the plurality of rolling members 37 shown in FIG. 12 are aligned in parallel along the spiral direction over the outer circumference of the guide member 33c so that the substrate 21 extends over the rolling members 37 in contact therewith. Accordingly, when the substrate 21 is hung along the spiral direction over the outer circumference of the guide member 33c, the direction in which the guide member 33c rotates and the direction in which the substrate 21 is conveyed match each other. The guide member 33c includes the guide body 36, and includes, though not shown in the drawings, the support member 38, the shaft 39, the securing members 40, and the bearings 41, which have the same functions as in the guide member 33c of the above-mentioned embodiment (see FIG. 10).

In FIG. 13 to FIG. 17, the rotatable members 37 are each a spherical ball. The roller member 33c has a ball bearing structure including the roller body (guide body) 36 and the rotatable members 37 that are each a ball.

Figure 14:
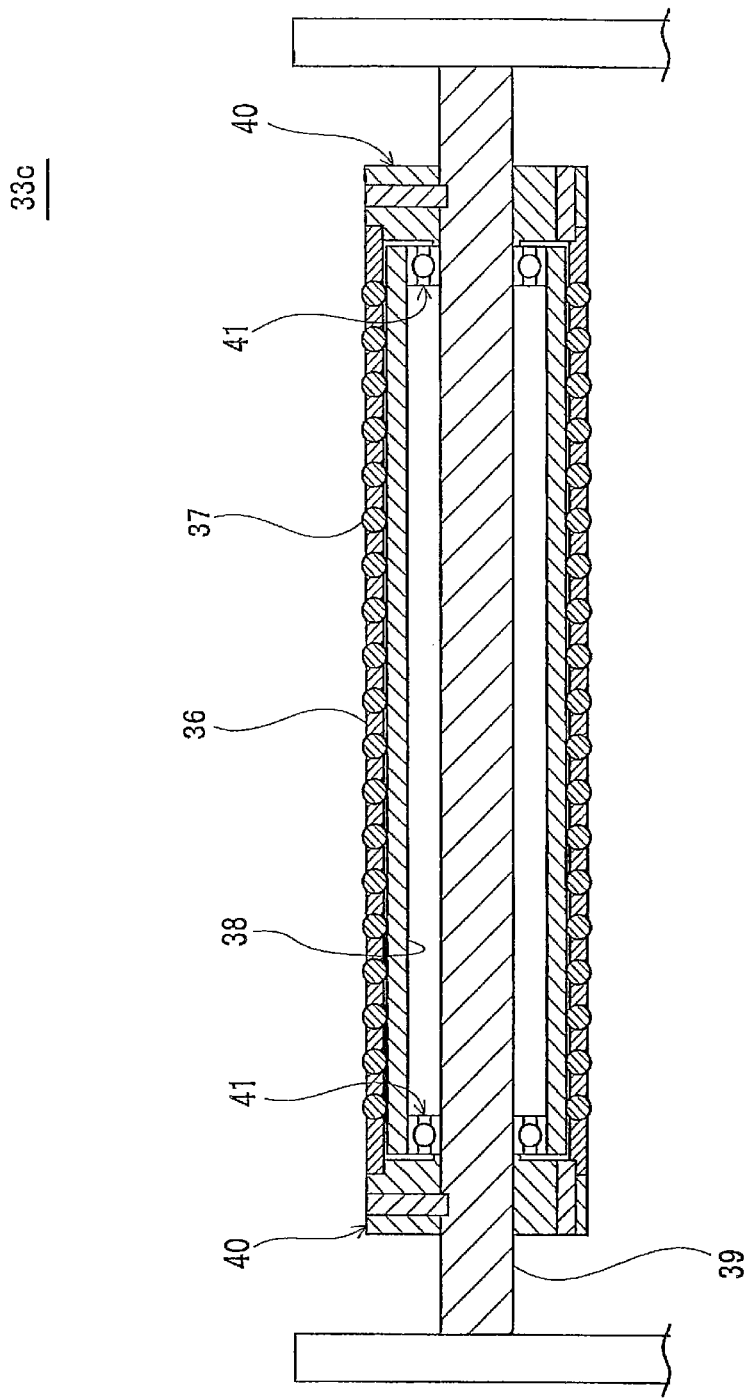
FIG. 14 is a sectional view taken along the line XIV-XIV of FIG. 13.

More specifically, as shown in FIG. 13 and FIG. 14, each rolling member 37 is provided so as to partially project from the guide body 36 outwardly in the radial direction of the guide body 36 and partially project from the guide body 36 inwardly in the radial direction of the guide body 36. Accordingly, the guide member 33c is formed so as to have an outer circumferential surface in the form of projections and recesses.

The plurality of rolling members 37 are aligned in parallel so that their portions that project outwardly in the radial direction from the guide body 36 are in contact with the substrate 21. Thus, the substrate 21 extends over the plurality of rolling members 37 in contact therewith. In other words, the substrate 21 is hung over the outer circumference of each of the guide members 33b and 33c so as to be in contact with the plurality of rolling members 37 but spaced from the guide body 36. Further, the rolling members 37 are provided so that each portion projecting from the guide body 36 inwardly in the radial direction is in contact with the outer circumference of the support member 38. In this embodiment, the rolling members 37 are each a spherical body that can rotate with three degrees of freedom.

The support member 38 supports the rolling members 37 on its outer circumference. This can prevent the substrate 21 from separating from the guide body 36 or deviating inwardly in the radial direction of the guide body 36, even though the rolling members 37 are subjected to a force applied inwardly in the radial direction of the guide member body 36 from the substrate 21 that is in contact with the rolling members 37.

Further, the bearings 41 allow rotation of the support member 38 about the axis direction (shaft 39). Accordingly, the friction with the rolling members 37 that roll as the substrate 21 is conveyed causes the support member 38 to rotate, which can stabilize the rotational speed of the rolling members 37 (to a substantially uniform rotational speed).

Figure 15:
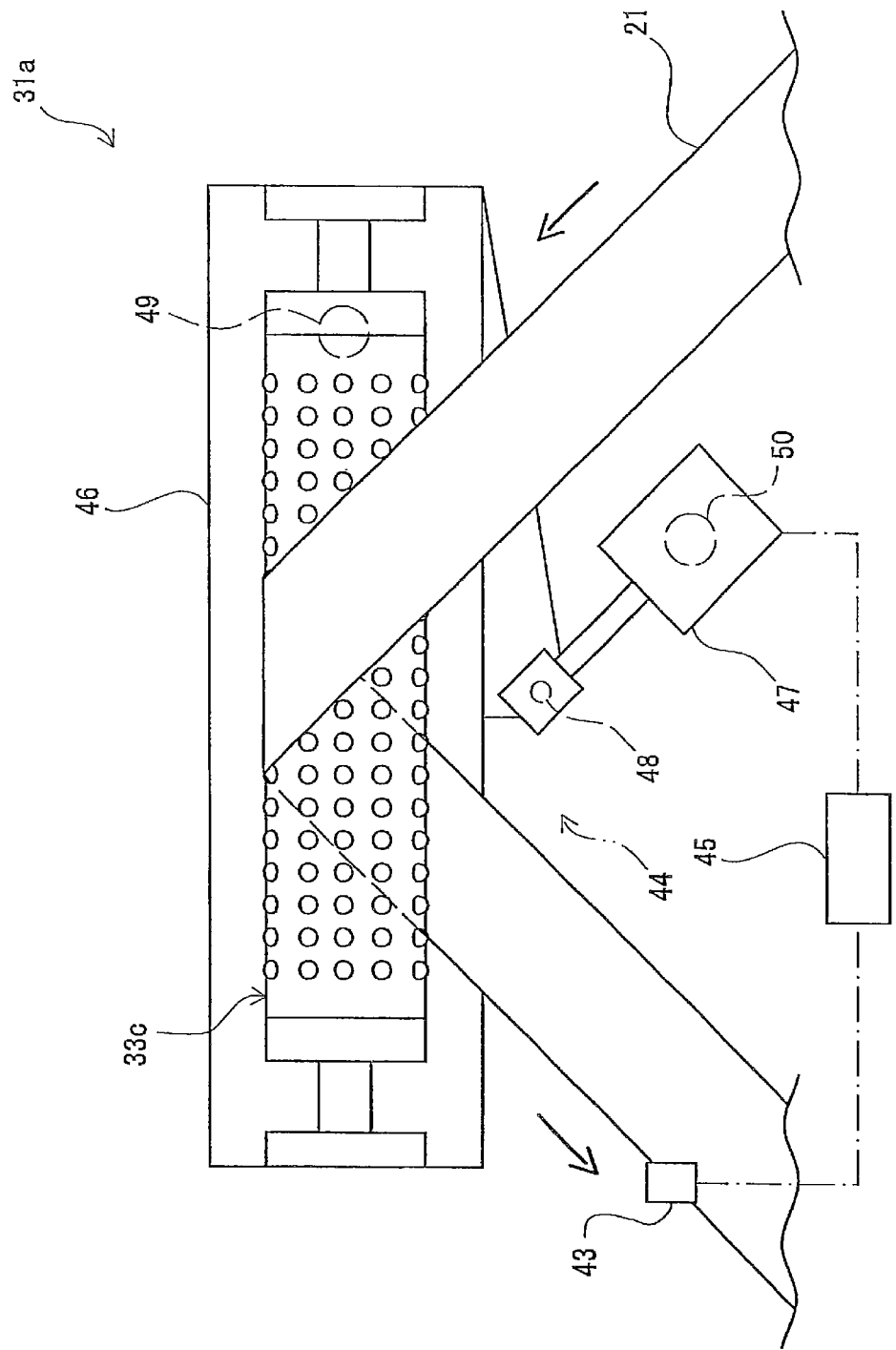
FIG. 15 is a schematic side view showing one embodiment of the guide mechanism.

Further, as shown in FIG. 15 and FIG. 16, the guide mechanism 31a, for example, includes a substrate position-detecting unit 43 that detects the position of the substrate 21 hung along the spiral direction over the outer circumference of the guide member 33c, a rotation mechanism 44 that rotates the guide member 33c about the direction intersecting the axis direction of the guide member 33c, and a control unit 45 that controls the rotation mechanism 44 according to the position of the substrate 21 detected by the substrate position-detecting unit 43.

The substrate position-detecting unit 43 is arranged, for example, on the downstream side of the guide member 33c. The substrate position-detecting unit 43 detects the position in the width direction of the substrate 21. In this embodiment, a CCD camera is used as the substrate position-detecting unit 43. The substrate position-detecting unit 43 may be a pair of photoelectric sensors arranged respectively on both sides in the width direction of the substrate 21. In short, the substrate position-detecting unit 43 only needs to be capable of detecting the position of the substrate 21.

The rotation mechanism 44 includes a rotation mechanism body 46 that secures both ends of the shaft 39 of the guide member 33c, a drive mechanism 47 that causes rotational displacement of the rotation mechanism body 46, and a coupling part 48 that rotatably couples the drive mechanism 47 to the rotation mechanism body 46. In this embodiment, the drive mechanism 47 is configured to extend or retract a cylinder by being actuated. The drive mechanism 47 only needs to be capable of causing rotational displacement of the rotation mechanism body 46.

The rotation mechanism 44 includes a body securing unit 49 that rotatably secures the rotation mechanism body 46 to the corresponding vacuum chamber 3, and a drive mechanism-securing unit 50 that rotatably secures the drive mechanism 47 to the vacuum chamber 3. The body securing unit 49 secures one side of the rotation mechanism body 46 to the vacuum chamber 3 so that the guide member 33c can rotate about the one side (the right side in FIG. 15) in the axis direction of the guide member 33c, with the substrate 21 hung along the spiral direction over the guide member 33c from the one side (the right side in FIG. 15) in the axis direction.

Figure 17:
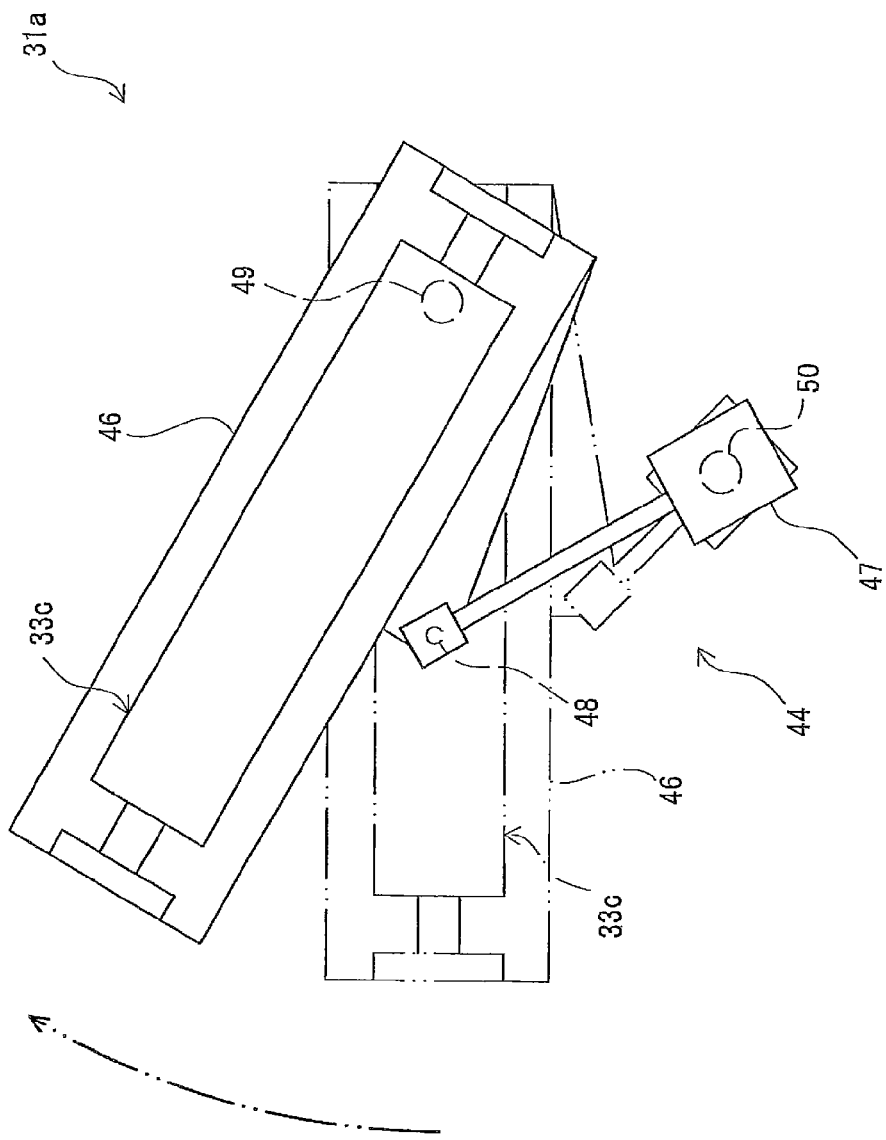
FIG. 17 is a schematic side view illustrating the operation of the guide mechanism of FIG. 15.

The control unit 45 determines, based on the information on the position of the substrate 21 detected by the substrate position-detecting unit 43, whether or not the position of the substrate 21 has deviated. Upon determining that the substrate 21 has deviated from a desired position, the control unit 45 actuates the drive mechanism 47, as shown in FIG. 17, thereby rotating the rotation mechanism body 46, specifically, the guide member 33c by a given angle.

According to the manufacturing method of this embodiment, the substrate position-detecting unit 43 detects the position in the width direction of the substrate 21 hung along the spiral direction over the outer circumference of the guide member 33c. The control unit 45 controls the rotation mechanism 44 according to the position of the substrate 21 detected by the substrate position-detecting unit 43, thereby rotating the guide member 33c about the direction intersecting the axis direction of the guide member 33c.

In this way, the control unit 45 rotates the guide member 33c through the rotation mechanism 44 in the case where the position of the substrate 21 has deviated from a desired position, thereby making it possible to adjust the position of the substrate 21. Accordingly, it is possible to prevent meandering movement of the substrate 21.

According to the description above, the present invention has the following features.

In order to guide a substrate in the form of a strip while supporting it, a guide member having an outer circumference over which the substrate is hung includes a plurality of rolling members (rotatable members) rollably aligned in parallel over the outer circumference so that the substrate is in contact therewith.

According to the guide member of the present invention, the plurality of rolling members are aligned in parallel over the outer circumference, and the substrate that is being conveyed is in contact with the plurality of rolling members. Accordingly, it is possible to reduce the area in contact with the substrate, for example, as compared to a cylindrical roller member having a smooth outer circumferential surface, thereby suppressing the friction with the substrate.

In addition, since the rolling members are rollable, the rolling members can roll as the substrate is conveyed. Accordingly, it is possible to suppress the friction with the substrate more effectively.

Each rolling member is a spherical body that can rotate with three degrees of freedom. Accordingly, the rolling member can rotate in any direction. Therefore, in whichever direction the substrate is hung over the outer circumference of the guide member, the rolling member can rotate in the conveyance direction of the substrate.

The plurality of rolling members are each a cylindrical body rotatable about the axis direction, and are aligned in parallel along the spiral direction over the outer circumference of the guide member. Alternatively, the plurality of rolling members are each a cylindrical body rotatable about the axis direction, and are aligned in parallel along the circumferential direction over the outer circumference of the guide member.

Such a configuration can reduce the contact area between the guide member and the substrate hung over the outer circumference of the guide member, and therefore can suppress the friction between the guide member and the substrate.

A guide mechanism includes: the guide member; a substrate position-detecting unit that detects the position in the width direction of the substrate hung along the spiral direction over the outer circumference of the guide member; a rotation mechanism that rotates the guide member about the direction intersecting the axis direction of the guide member; and a control unit that controls the rotation mechanism according to the position of the substrate detected by the substrate position-detecting unit.

According to the guide mechanism of the present invention, the substrate position-detecting unit detects the position in the width direction of the substrate hung along the spiral direction over the outer circumference of the guide member. The control unit controls the rotation mechanism according to the position of the substrate detected by the substrate position-detecting unit, thereby rotating the guide member about the direction intersecting the axis direction of the guide member. In this way, the control unit rotates the guide member through the rotation mechanism in the case where the position of the substrate 21 has deviated from a desired position, thereby making it possible to adjust the position of the substrate. Accordingly, it is possible to prevent meandering movement of the substrate.

Provided is a method for manufacturing an organic EL device in which a vaporized material is deposited over a substrate in the form of a strip that is being conveyed, so that constituent layers of an organic EL element are formed over a deposition surface that is a surface on one side of the substrate. The method includes a direction changing step of changing the direction of the deposition surface of the substrate using a guide member.

Next, embodiments of a method for manufacturing an organic EL device using the above-mentioned manufacturing apparatus are described.

In the method for manufacturing an organic EL device according to this embodiment, constituent layers of the organic EL element 19 are formed by deposition over the substrate 21 in the form of a strip, while the substrate 21 is being moved in the longitudinal direction.

This manufacturing method includes a constituent layer-forming step of performing deposition over one surface of the substrate 21, while the substrate 21 is being moved in the longitudinal direction, sequentially in a plurality of the deposition units A to D (first and second deposition units) arranged along the moving direction of the substrate 21 by discharging a vaporized material from an evaporation source 21*a*.

The constituent layer-forming step includes: a plurality of upward deposition steps of performing deposition over the deposition surface 21*a*, while the substrate 21 is being moved with the deposition surface 21*a* facing downward, in the deposition units A to D (first and second deposition units) by discharging a vaporized material from the evaporation sources 9*a* to 9*j* arranged below the substrate 21 toward the deposition surface 21*a*; and a direction changing step of turning the substrate 21 conveyed from the deposition unit A, B, or C (first deposition unit), using the guide mechanism 31*a*, 31*b*, or 31*c* provided between the deposition unit A, B, or C (first deposition unit) and the deposition unit B, C, or D (second deposition unit), so that the deposition surface 21*a* faces upward and thereafter downward, while supporting the substrate 21 from the non-deposition surface 21*b* side so that the non-deposition surface 21*b* of the substrate 21 faces the inside of the turn, so as to guide the substrate 21 to the deposition unit B or C (second deposition unit).

Specifically in this embodiment, the substrate 21 wound into a roll is first unwound from the substrate feeding unit 5, for example.

Subsequently, the anode layer 23 (e.g., an Al layer) is formed in the deposition unit A by discharging an anode layer-forming material upward from the evaporation source 9*a* toward the lower surface (deposition surface) of the unwound substrate 21, while the substrate 21 is being moved. Then, an edge cover-forming material is discharged from the evaporation source 9*b*, thereby forming the edge cover 24 so as to cover the peripheral edges of the anode layer 23 (upward deposition step).

Subsequently, the guide mechanism 31*a* turns the substrate 21 conveyed from the deposition unit A (first deposition unit) on the upstream side with the deposition surface 21*a* facing downward so that the deposition surface 21*a* faces upward and thereafter downward, while supporting the substrate 21 from the non-deposition surface 21*b* side so that the non-deposition surface 21*b* of the substrate 21 faces the inside of the turn, so as to guide the substrate 21 to the deposition unit B (second deposition unit) on downstream side with the deposition surface 21*a* facing downward (direction changing step).

In the deposition unit B, three of five organic EL layer-constituent layers (for example, a hole injection layer, a hole transporting layer, and a light emitting layer) are formed by discharging materials for forming organic EL layer-constituent layers upward from the evaporation sources 9*c* to 9*e* arranged below the substrate 21 toward the deposition surface 21*a* of the substrate 21, while the substrate 21 conveyed from the guide mechanism 31*a* is being moved (upward deposition step).

Subsequently, the guide mechanism 31*b* turns the substrate 21 conveyed from the deposition unit B (first deposition unit) on the upstream side with the deposition surface 21*a* facing downward so that the deposition surface 21*a* faces upward and thereafter downward, while supporting the substrate 21 from the non-deposition surface 21*b* side so that the non-deposition surface 21*b* of the substrate 21 faces the inside of the turn, so as to guide the substrate 21 to the deposition unit C on downstream side (second deposition unit) with the deposition surface 21*a* facing downward (direction changing step).

In the deposition unit C, the remaining two of five organic EL layer-constituent layers (for example, an electron transporting layer and an electron injection layer) are formed by discharging materials for forming organic EL layer-constituent layers upward from the evaporation sources 9*f* and 9*g* arranged below the substrate 21 toward the deposition surface 21*a* of the substrate 21, while the substrate 21 conveyed from the guide mechanism 31*b* is being moved (upward deposition step).

Subsequently, the guide mechanism 31*c* turns the substrate 21 conveyed from the deposition unit C (first deposition unit) on the upstream side with the deposition surface 21*a* facing downward so that the deposition surface 21*a* faces upward and thereafter downward, while supporting the substrate 21 from the non-deposition surface 21*b* side of the substrate 21 so that the non-deposition surface 21*b* faces the inside of the turn, so as to guide the substrate 21 to the deposition unit D on downstream side (second deposition unit) with the deposition surface 21*a* facing downward (direction changing step).

In the deposition unit D, the cathode layer 27 composed of two cathode layer-constituent layers (for example, a LiF layer and a Mg—Ag alloy layer) is formed by discharging cathode layer-forming materials upward from the evaporation sources 9*h* and 9*i* arranged below the substrate 21 toward the deposition surface 21*a* of the substrate 21, while the substrate 21 conveyed from the guide mechanism 31*c* is being moved. A sealing layer (for example, a $MoO_3$ layer) 29 is formed by discharging a sealing layer-forming material upward from the evaporation source 9*j* (upward deposition step).

As described above, the organic EL element 19 can be formed over the substrate 21. Further, while the organic EL element 19 is formed over the substrate 21, the substrate 21 over which the organic EL element 19 has been formed is wound up by the substrate take-up unit 6.

In this way, an organic EL device 20 can be manufactured. In this embodiment, the organic EL device 20 includes the substrate 21, the organic EL element 19, the edge cover 24, and the sealing layer 29. The organic EL element 19 includes the anode layer 23, the organic EL layer 25, and the cathode layer 27.

According to such a manufacturing method, after constituent layers are formed over the deposition surface 21*a* of the substrate 21 that faces downward in the deposition unit A, B, or C (first deposition unit) on the upstream side by discharging vaporized materials upward from the evaporation sources 9*a* to 9*g*, the guide mechanism 31*a*, 31*b*, or 31*c* turns the substrate 21 over which the constituent layers have been formed so that the deposition surface 21*a* faces upward and thereafter downward, while supporting the substrate 21 from the non-deposition surface 21*b* side so that the non-deposition surface 21*b* faces the inside of the turn, thus guiding the substrate to the deposition unit B, C, or D (second deposition unit) on the downstream side with the deposition surface 21*a* facing downward. Subsequently, in the deposition unit B, C, or D on the downstream side, constituent layers can be continuously formed over the deposition surface 21*a* of the substrate 21 that faces downward by discharging vaporized materials upward from the evaporation sources 9*c* to 9*j*. It should be noted that, although the evaporation sources 9*a* to 9*j* are used herein for deposition, the evaporation sources 9*k* and 9*l* also may be used additionally for deposition.

In this way, it is possible to prevent incorporation of foreign matter dropped from the evaporation sources 9*a* to 9*j* by discharging a vaporized material upward from each of the evaporation sources 9a to 9j (or 9a to 9l, the same applies to the followings) in the upward deposition step. It is therefore possible to prevent light emission failure due to incorporation of such foreign matter.

Further, it is possible to give a desired tension to the substrate 21 by supporting the substrate 21 between the deposition units A and D (between the first deposition unit and the second deposition unit), thereby suppressing warpage and vibration of the substrate 21. This can reduce the damage on the deposition surface 21a of the substrate 21 due to the contact with the evaporation sources 9a to 9j. Furthermore, it is also possible to suppress variation in the distance between the substrate 21 and each of the evaporation sources 9a to 9j, so as to control the thickness of constituent layers appropriately. This can suppress the degradation in emission properties.

Moreover, supporting the non-deposition surface 21b of the substrate 21 can reduce damage on the deposition surface 21a of the substrate 21.

Accordingly, the organic EL device 20 capable of suppressing quality degradation can be manufactured.

Furthermore, the guide mechanisms 31a to 31c provided between the deposition units A and D each can change the moving direction viewed from above of the substrate 21 between before and after the substrate 21 is guided by the guide mechanisms 31a to 31c. This makes it possible to arrange the deposition units A to D at desired positions, and thus the degree of freedom in layout for the deposition units A to D can be enhanced. Further, production space also can be effectively used.

In this embodiment, the guide mechanisms 31a to 31c have a plurality of the roller members 33a to 33l that support the non-deposition surface 21b, and at least one of the roller members is arranged along a direction inclined to the width direction of the substrate. This makes it easy to turn the deposition surface 21a of the substrate 21, as mentioned above, with a simple configuration of combining these roller members, which is therefore more efficient.

Further, in this embodiment, at least one of the above-mentioned roller members is arranged along a direction inclined at 45° to the width direction of the substrate 21. This can prevent complicated combination of the roller members, and prevent an increase in size of the apparatus, as well.

The method and apparatus for manufacturing an organic EL device of the present invention are as described above. However, the present invention is not limited to the above-mentioned embodiments of the present invention, and the design can be appropriately modified within the scope intended by the present invention. For example, the configuration of each guide mechanism is not specifically limited to the above-mentioned embodiments. It is also possible to employ the arrangement, number, or combination of roller members other than above, as long as the guide mechanism can turn the substrate conveyed from the first deposition unit with its deposition surface facing downward so that the deposition surface faces upward and thereafter downward, while supporting the substrate from the non-deposition surface side so that the non-deposition surface of the substrate faces the inside of the turn, so as to guide the substrate to the second deposition unit with the deposition surface facing downward. Further, although the substrate after the completion of deposition steps is wound up in the above-mentioned embodiments, the substrate may be subjected to another step, such as cutting, without winding-up.

Further, the above-mentioned embodiments describe the guide member with a configuration in which the support member 38 is rotatable with respect to the shaft 39, which however is not restrictive. For example, it is also possible to employ a configuration in which the support member 38 is secured to the shaft 39 so as not to rotate with respect to the shaft 39, even if the rolling members 37 are rotated.

Further, the above-mentioned embodiments describe the guide member with a configuration in which the guide body 36 is secured to the shaft 39 and thus does not rotate with respect to the shaft 39 when the substrate 21 is conveyed, which however is not restrictive. For example, it is also possible to employ a configuration in which the guide body 36 is rotatable with respect to the shaft 39 and thus rotates with respect to the shaft 39 as the substrate 21 is conveyed.

Further, the above-mentioned embodiments describe the guide member with a configuration in which a plurality of rolling members 37 are aligned in parallel over the entire region in the circumferential direction and the entire region in the axis direction (longitudinal direction) of the guide body 36, which however is not restrictive. The rolling members 37 at least need to be aligned in parallel in the contact region of the guide member with the substrate 21.

Further, it is also possible to employ the guide mechanism with a configuration in which the arrangement, number, or combination of guide members is changed. Further, although the substrate after the completion of deposition steps is wound up in the above-mentioned embodiments, the substrate may be subjected to another step, such as cutting, without winding-up.

Next, the present invention is described further in detail by way of examples. However, the present invention is not limited to these examples.

(Example)

The same manufacturing apparatus as the manufacturing apparatus 1 shown in FIG. 1 was used, and a structure composed of one anode layer, five organic EL layers, and one cathode layer was employed. Further, the shortest distance between the substrate and each evaporation source was set to 2 mm. Using the manufacturing apparatus, an anode layer (Al), an edge cover ($SiO_2$), a hole injection layer (HAT-CN), a hole transporting layer (α-NPD), a light emitting layer (Alq3), an electron transporting layer (LiF), an electron injection layer (LiF), a cathode layer (Mg-Ai alloy), and a sealing layer ($MoO_3$) were sequentially deposited over the substrate (SUS) 21 in this order. Thus, an organic EL device was produced.

Figure 9:
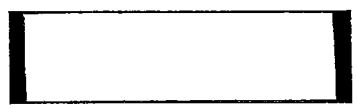
FIG. 9 shows pictures of the test samples of Example and Comparative Example, as viewed from their organic EL element side.
Figure 9:

The thus obtained organic EL device was cut into dimensions of 30 cm (in the moving direction of the substrate)×3.8 cm (in the width direction of the substrate) to produce test samples. A voltage was applied to the anode layer and the cathode layer of the resultant test samples, and the relationship between the applied voltage (V) and the emission brightness ($cd/m^2$) was investigated. The emission brightness was measured using an organic EL light emission efficiency measuring apparatus (EL-1003, manufactured by PRECISE GAUGES Co., Ltd.). Pictures of the test samples after the voltage application, as viewed from their organic EL element side, were taken with a digital microscope (VHX-1000, manufactured by KEYENCE CORPORATION). FIG. 8 shows the thus obtained relationship between the applied voltage and the emission brightness. FIG. 9 shows the pictures of the test samples after the voltage application.

As shown in FIG. 8, current leakage was not recognized even when a voltage was applied to the anode layer and the cathode layer of the organic EL device obtained above. Breakage of the organic EL device due to current leakage was not recognized after the application of voltage, as shown in FIG. 9.

(Comparative Example)

Figure 7:
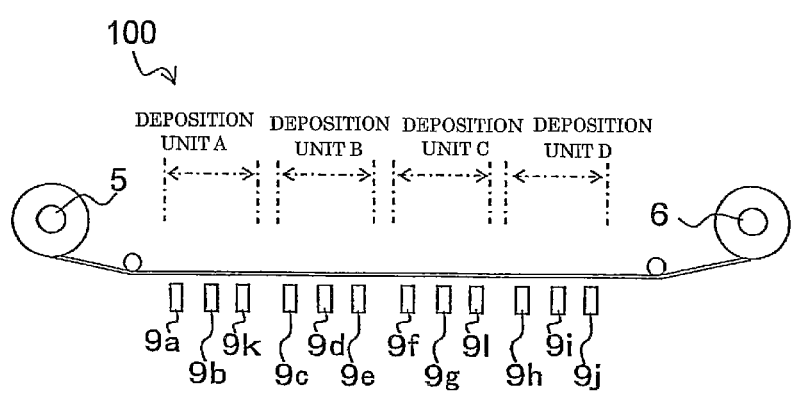
FIG. 7 is a schematic side view schematically showing a manufacturing apparatus used in Comparative Example.

The same manufacturing apparatus as the manufacturing apparatus 100 shown in FIG. 7 was used. That is, as a manufacturing apparatus, the same manufacturing apparatus as in FIG. 1 except that the deposition units A to D were linearly arranged and the guide mechanisms were not provided between the deposition units A and D was used. It should be noted that illustration of vacuum chambers is omitted in the manufacturing apparatus shown in FIG. 7.

Using this manufacturing apparatus, an organic EL device was produced in the same manner as in Example. As a result, the substrate warped, and the deposition surface of the substrate and each evaporation source were brought into contact, thus causing abrasion on the deposition surface of the substrate. Further, test samples obtained from this organic EL device in the same manner as in Example were subjected to evaluation. FIG. 8 shows the thus obtained relationship between the applied voltage and the emission brightness. FIG. 9 shows the pictures of the test samples after the voltage application. As shown in FIG. 8, current leakage due to the above-mentioned abrasion on the deposition surface of the substrate was recognized in Comparative Example. Further, due to such current leakage, breakage of the organic EL device was recognized after the voltage application, as shown in FIG. 9.

It has been found from the above results that the method and the apparatus for manufacturing an organic EL device according to the present invention make it possible to manufacture an organic EL device capable of suppressing quality degradation.

REFERENCE SIGNS LIST

1: Organic EL device-manufacturing apparatus
3: Vacuum chamber
9a to 9l: Evaporation source
19: Organic EL element
21: Substrate
21a: Deposition surface
21b: Non-deposition surface
23: Anode layer
25: Organic EL layer
27: Cathode layer
30a, 30b, 30c: Direction changing unit
31a to 31c: Guide mechanism
33a to 33l: Roller member (Guide member)

The invention claimed is:

1. A method for manufacturing an organic EL device, in which constituent layers of an organic EL element are formed by deposition over a substrate in the form of a strip, while the substrate is being moved in a longitudinal direction, the method comprising:
    a constituent layer-forming step of performing deposition over one surface of the substrate, while the substrate is being moved in the longitudinal direction, sequentially in at least first and second deposition units arranged along the moving direction of the substrate by discharging a vaporized material from an evaporation source, wherein
    the constituent layer-forming step comprises:
        an upward deposition step of performing deposition over a deposition surface of the substrate, while the substrate is being moved with its deposition surface facing downward, in the first and second deposition units by discharging the vaporized material from the evaporation source arranged below the substrate toward the deposition surface; and
        a direction changing step of turning the substrate conveyed from the first deposition unit, by means of a guide mechanism provided between the first deposition unit and the second deposition unit, so that the deposition surface faces upward and thereafter downward, while supporting the substrate from the non-deposition surface side so that the non-deposition surface of the substrate faces the inside of the turn, so as to guide the substrate to the second deposition unit,
    wherein the moving direction of the substrate viewed from above the first deposition unit within the first deposition unit is a first direction and the moving direction of the substrate viewed from above the second deposition unit within the second deposition unit is a second direction and the first direction and the second direction are different from each other.

2. The method for manufacturing an organic EL device according to claim 1, wherein
    the guide mechanism has a plurality of roller members that support the non-deposition surface, and
    at least one of the roller members is arranged along a direction inclined to a width direction of the substrate.

3. The method for manufacturing an organic EL device according to claim 2, wherein
    the at least one of the roller members is arranged along a direction inclined at 45.degree. to the width direction.

4. An apparatus for manufacturing an organic EL device, in which constituent layers of an organic EL element are formed by deposition over a substrate in the form of a strip, while the substrate is being moved in a longitudinal direction, the apparatus comprising:
    at least first and second deposition units arranged along the moving direction of the substrate, the deposition units each including an evaporation source arranged below the substrate that is being moved, the deposition units being configured to perform deposition by discharging a vaporized material from the evaporation source toward a deposition surface, while the substrate is being moved with its deposition surface facing downward; and
    a direction changing unit comprising a guide mechanism provided between the first deposition unit and the second deposition unit, the guide mechanism being configured to turn the substrate conveyed from the first deposition unit so that the deposition surface faces upward and thereafter downward, while supporting the substrate from a non-deposition surface side so that the non-deposition surface of the substrate faces the inside of the turn, so as to guide the substrate to the second deposition unit,
    wherein the moving direction of the substrate viewed from above the first deposition unit within the first deposition unit is a first direction and the moving direction of the substrate viewed from above the second deposition unit within the second deposition unit is a second direction and the first direction and the second direction are different from each other.

* * * * *